(12) United States Patent
Moriyasu

(10) Patent No.: US 11,616,033 B2
(45) Date of Patent: Mar. 28, 2023

(54) SEMICONDUCTOR DEVICE

(71) Applicant: KIOXIA CORPORATION, Tokyo (JP)

(72) Inventor: Noriyuki Moriyasu, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/408,756

(22) Filed: Aug. 23, 2021

(65) Prior Publication Data
US 2022/0246560 A1   Aug. 4, 2022

(30) Foreign Application Priority Data

Feb. 3, 2021   (JP) .............................. JP2021-015671

(51) Int. Cl.
| | | |
|---|---|---|
| H01L 21/66 | (2006.01) | |
| H01L 23/00 | (2006.01) | |
| H01L 25/065 | (2023.01) | |

(52) U.S. Cl.
CPC .............. *H01L 24/05* (2013.01); *H01L 22/32* (2013.01); *H01L 24/48* (2013.01); *H01L 24/73* (2013.01); *H01L 25/0657* (2013.01); *H01L 2224/04042* (2013.01); *H01L 2224/05555* (2013.01); *H01L 2224/484* (2013.01); *H01L 2224/48091* (2013.01); *H01L 2224/48624* (2013.01); *H01L 2224/48647* (2013.01); *H01L 2224/73265* (2013.01)

(58) Field of Classification Search
CPC ......... H01L 24/05; H01L 22/32; H01L 24/48; H01L 24/73; H01L 25/0657; H01L 2224/04042; H01L 2224/05555; H01L 2224/48091; H01L 2224/484; H01L 2224/48624; H01L 2224/48647; H01L 2224/73265; H01L 2224/05554; H01L 24/49; H01L 24/85; H01L 2224/06133; H01L 2224/06135; H01L 2224/06138; H01L 2224/49175; H01L 2224/859; H01L 2924/00014; H01L 24/06; H01L 2224/49431; H01L 2924/1434
See application file for complete search history.

(56) References Cited

U.S. PATENT DOCUMENTS

2003/0218245 A1   11/2003   Matsuzawa et al.

FOREIGN PATENT DOCUMENTS

| | | |
|---|---|---|
| JP | 2003338519 A | 11/2003 |
| JP | 2016062212 A | 4/2016 |

*Primary Examiner* — Elias Ullah
(74) *Attorney, Agent, or Firm* — Kim & Stewart LLP

(57) ABSTRACT

A semiconductor device includes a substrate, a semiconductor chip, a plurality of bonding pads on a surface of the semiconductor chip, a plurality of probe pads on a surface of the semiconductor chip, a plurality of connection pads on a surface of the substrate, and a plurality of bonding wires that electrically connect the bonding pads and the connection pads. The plurality of bonding pads include a first bonding pad and a second bonding pad, the plurality of probe pads include a first probe pad and a second probe pad, and a part of the first probe pad is disposed between the second bonding pad and the second probe pad.

20 Claims, 5 Drawing Sheets

SEMICONDUCTOR DEVICE

CROSS-REFERENCE TO RELATED APPLICATION

This application is based upon and claims the benefit of priority from Japanese Patent Application No. 2021-015671, filed Feb. 3, 2021, the entire contents of which are incorporated herein by reference.

FIELD

Embodiments described herein relate generally to a semiconductor device.

BACKGROUND

Wire bonding is known as one of various methods for connecting a semiconductor chip and a substrate inside a package of a semiconductor device. One end of a wire is connected to an upper surface of a bonding pad provided on the semiconductor chip. The other end of the wire is connected to an upper surface of a connection pad provided on the substrate. The bonding pad and the connection pad are electrically connected via the wire. At the time of fabrication, a probe test (i.e., a performance test carried out using a probe) for the semiconductor chip is conducted by bringing a probe into contact with the bonding pad.

DETAILED DESCRIPTION

Embodiments provide a semiconductor device that achieves a high degree of integration and a small package thickness and can obtain good electrical connection.

In general, according to one embodiment, a semiconductor device includes a substrate, a semiconductor chip provided above a surface of the substrate and having a first side extending in a first direction and a second side extending in a second direction crossing the first direction, a plurality of bonding pads provided on a surface of the semiconductor chip along the first side, a plurality of probe pads provided on the surface of the semiconductor chip and placed in locations closer to an interior of the semiconductor chip than the plurality of bonding pads with respect to the first side, a plurality of connection pads provided on the surface of the substrate along the first side, and a plurality of bonding wires, each electrically connecting a corresponding one of the plurality of bonding pads and a corresponding one of the plurality of connection pads. The plurality of bonding pads include a first bonding pad and a second bonding pad placed in a location closer to an interior of the semiconductor chip than the first bonding pad with respect to the first side. The plurality of probe pads include a first probe pad electrically connected to the first bonding pad and a second probe pad electrically connected to the second bonding pad and placed in a location closer to an interior of the semiconductor chip than the first probe pad with respect to the first side. A part of the first probe pad is disposed between the second bonding pad and the second probe pad in the second direction.

Hereinafter, embodiments of the present disclosure will be described with reference to the drawings.

First Embodiment

Figure 1:
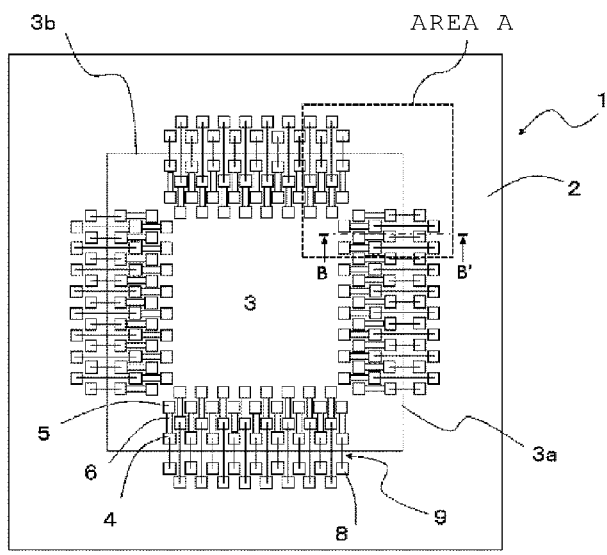
FIG. 1 is a plan view showing the internal structure of a semiconductor device according to a first embodiment.
Figure 2:
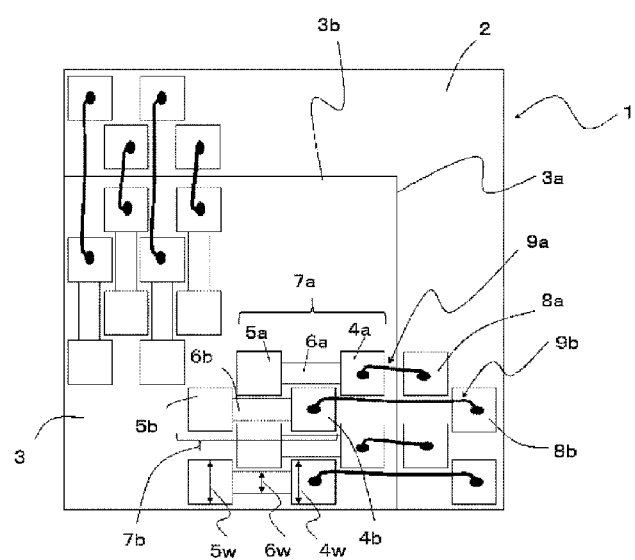
FIG. 2 is an enlarged plan view of an area A of FIG. 1.
Figure 3:
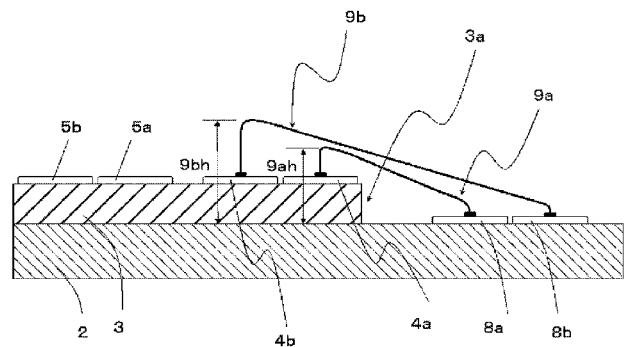
FIG. 3 is a diagram viewed from a cross section taken along line B-B' of FIG. 1.
Figure 4:
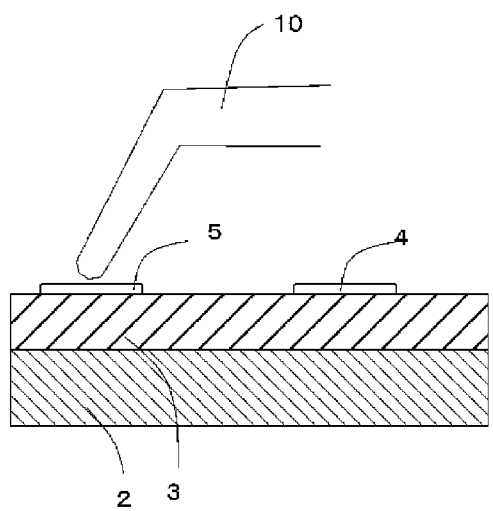
FIG. 4 is a diagram showing a probe test performed during the process of manufacturing the semiconductor device of the first embodiment.

A semiconductor device 1 of a first embodiment will be described with reference to FIGS. 1 to 4. FIG. 1 is a plan view showing the internal structure of the semiconductor device 1 according to the first embodiment. FIG. 2 is an enlarged plan view of an area A of FIG. 1. FIG. 3 is a diagram viewed from a cross section taken along line B-B' of FIG. 1. FIG. 4 is a diagram showing a probe test performed during the process of manufacturing the semiconductor device 1 of the first embodiment.

As shown in FIG. 1, the semiconductor device 1 of the present embodiment includes a substrate 2 and a semiconductor chip 3 mounted above a principal surface of the substrate 2. The semiconductor chip 3 includes a bonding pad 4. The substrate 2 includes a connection pad 8. A bonding wire 9 connects the bonding pad 4 and the connection pad 8.

The substrate 2 is formed by using a multilayer interconnection substrate, a silicon chip, or the like. The present embodiment can be implemented also in a case where a plurality of semiconductor chips are stacked; in that case, the substrate 2 is a semiconductor chip. The semiconductor chip 3 is, for example, an interface chip or a controller chip and can control writing and reading of data. Moreover, the semiconductor chip 3 may be a memory chip with a memory element such as NAND flash memory. The shape of a plane, which intersects a thickness direction, of the semiconductor chip 3 is a square shape, and the semiconductor chip 3 has a first side 3a extending in a first direction and a second side 3b extending in a second direction orthogonal to the first direction. In the present embodiment, the semiconductor chip 3 is a square; the shape thereof, however, is not limited to a square.

As shown in FIG. 2, a plurality of bonding pads 4 are, for example, pad-like electrodes formed by using metal such as Al. The plurality of bonding pads 4 are placed on a principal surface of the semiconductor chip 3 along the first side 3a of the semiconductor chip 3, and include a first bonding pad 4a and a second bonding pad 4b. The second bonding pad 4b is farther away from the first side 3a and the second side 3b of the semiconductor chip 3 than the first bonding pad 4a and is placed on the interior side of the semiconductor chip 3.

A plurality of probe pads 5 are, for example, pad-like electrodes formed by using an alloy of Ni and Fe or metal such as Cu. The plurality of probe pads 5 may be used when a probe test is conducted. The plurality of probe pads 5 are placed on the principal surface of the semiconductor chip 3 along the first side 3a of the semiconductor chip 3 in locations closer to the interior of the semiconductor chip 3 than the plurality of bonding pads 4, and include a first probe pad 5a and a second probe pad 5b. The second probe pad 5b is farther away from the first side 3a and the second side 3b of the semiconductor chip 3 than the first probe pad 5a and is placed on the interior side of the semiconductor chip 3. The first bonding pad 4a, the second bonding pad 4b, the first probe pad 5a, and the second probe pad 5b are placed in this order from the first side 3a of the semiconductor chip 3 toward a central part thereof. In the example given herein, the bonding pad 4 and the probe pad 5 in FIG. 2 are squares and identical in height and width; however, the embodiment is not limited to this example. The bonding pad 4 may be a square and the probe pad 5 may be a triangle. As will be described later, the bonding pad 4 may be a hexagon and the probe pad 5 may be a square.

Each of a plurality of connecting portions 6 electrically connects a corresponding one of the plurality of bonding pads 4 and a corresponding one of the plurality of probe pads 5. For example, the plurality of connecting portions 6 include a first connecting portion 6a connecting the first bonding pad 4a and the first probe pad 5a and a second connecting portion 6b connecting the second bonding pad 4b and the second probe pad 5b. The width 6w of each of the plurality of connecting portions 6 in the first direction is smaller than the width 4w of each of the plurality of bonding pads 4 in the first direction and the width 5w of each of the plurality of probe pads 5 in the first direction (4w>6w, 5w>6w).

Each of a plurality of composite pads includes a corresponding one of the plurality of bonding pads 4, a corresponding one of the plurality of probe pads 5, and a corresponding one of the plurality of connecting portions 6. Moreover, the composite pads include a first composite pad 7a and a second composite pad 7b. The first composite pad 7a includes the first bonding pad 4a, the first probe pad 5a, and the first connecting portion 6a, and the second composite pad 7b includes the second bonding pad 4b, the second probe pad 5b, and the second connecting portion 6b. Apart of the first probe pad 5a is located between the second bonding pad 4b and the second probe pad 5b, a part of the second bonding pad 4b is located between the first bonding pad 4a and the first probe pad 5a, and the first composite pad 7a and the second composite pad 7b are arranged in an interlocking manner with a space left therebetween. In the present embodiment, the first composite pad 7a and the second composite pad 7b are arranged in a staggered arrangement in which they are alternately and repeatedly arranged along the first side 3a of the semiconductor chip 3; an arrangement is not limited to this example.

A plurality of connection pads 8 are placed along the first side 3a of the semiconductor chip 3 mounted on the principal surface of the substrate 2. The plurality of connection pads 8 include a first connection pad 8a and a second connection pad 8b. In the present embodiment, the distance from the second connection pad 8b to the first side 3a of the semiconductor chip 3 is greater than the distance from the first connection pad 8a to the first side 3a of the semiconductor chip 3. The first connection pad 8a and the second connection pad 8b are arranged in a staggered arrangement in which they are alternately and repeatedly arranged along the first side 3a of the semiconductor chip 3; an arrangement is not limited to this example.

A plurality of bonding wires 9 are formed by using Cu, Au, or Al, for example, and electrically connect the semiconductor chip 3 and the substrate 2. As a connection method, ball bonding or wedge bonding, for example, is used. Each of the plurality of bonding wires 9 electrically connects a corresponding one of the plurality of bonding pads 4 and a corresponding one of the plurality of connection pads 8, and the plurality of bonding wires 9 include a first bonding wire 9a and a second bonding wire 9b. The first bonding pad 4a and the first connection pad 8a are connected by the first bonding wire 9a, and the second bonding pad 4b and the second connection pad 8b are connected by the second bonding wire 9b.

As described above, according to the present embodiment, as shown in FIG. 2, the first composite pad 7a and the second composite pad 7b are arranged in an interlocking manner with a space left therebetween, which makes it possible to make effective use of a limited area on the semiconductor chip 3. Therefore, it is possible to increase the number of bonding pads 4 that can be placed per side of the semiconductor chip 3, and it is possible to reduce the size of the semiconductor chip 3 when compared to the size of a semiconductor chip having the same number of bonding pads 4 and thereby achieve a high degree of integration.

The above description is given by taking as an example a part of the semiconductor device 1 including the first side 3a and the second side 3b; each of the other sides of the semiconductor chip 3 have a similar configuration and an explanation of a configuration for the other two sides is omitted.

Furthermore, as shown in FIG. 3, the height 9ah of the first bonding wire 9a above the substrate 2 is lower than the height 9bh of the second bonding wire 9b above the substrate 2 (9bh>9ah). Therefore, according to the present embodiment, by placing the second bonding pad 4b in a location on the semiconductor chip 3 closer to the exterior, it is possible to shorten the length of the bonding wire 9b and make lower the height thereof above the substrate 2. This makes it possible to reduce the package thickness of the semiconductor device 1.

Moreover, as shown in FIG. 4, when the semiconductor device 1 is fabricated, a probe test (which is a performance test using a probe) is conducted by bringing a probe 10 into contact with the probe pad 5. In the probe test, the electrical characteristics of an electric circuit provided on the semiconductor chip 3 are measured using an inspection apparatus (which is not shown in FIG. 4) electrically connected to the probe 10, and a determination on whether the semiconductor chip 3 is a non-defective item or a defective item is made. During this process, the probe 10 makes contact with the probe pad 5, and may cause a scratch, that is, a contact mark thereon. Since the bonding pad 4 is independently provided in a location away from the probe pad 5, there is no need for the bonding pad 4 to make contact with the probe 10, which makes it possible to prevent the occurrence of a contact mark on the bonding pad 4. As a result, when the bonding wire 9 is crimped onto the bonding pad 4 after the probe test, it is possible to obtain good electrical connection because the contact mark is not present on the bonding pad 4.

Second Embodiment

Next, a semiconductor device 1 according to a second embodiment of the present disclosure will be described with reference to FIGS. 5 to 7. The second embodiment is different from the first embodiment in that the shape of a bonding pad 4 on a semiconductor chip 3 is changed. Since the semiconductor device 1 of the second embodiment is similar to the semiconductor device 1 of the first embodiment except for the shape of the bonding pad 4 on the semiconductor chip 3, the same portions will be denoted by the same reference signs and a detailed explanation will be omitted.

Figure 5:
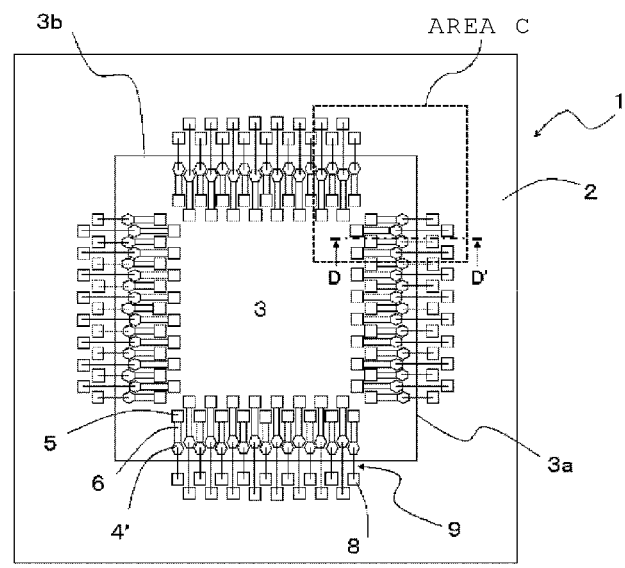
FIG. 5 is a plan view showing the internal structure of a semiconductor device according to a second embodiment.
Figure 6:
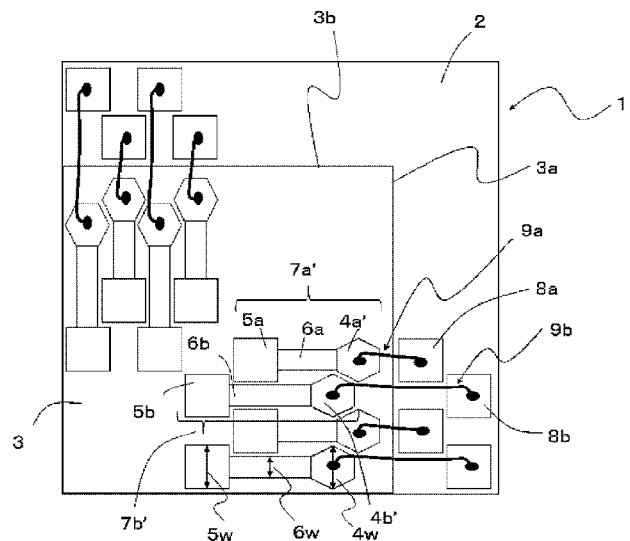
FIG. 6 is an enlarged plan view of an area C of FIG. 5.
Figure 7:
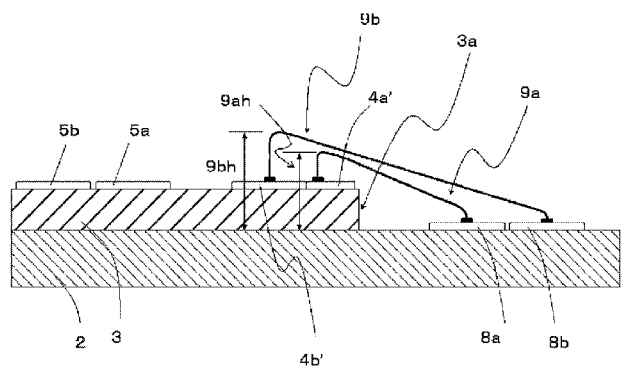
FIG. 7 is a diagram viewed from a cross section taken along line D-D' of FIG. 5.

FIG. 5 is a plan view showing the internal structure of the semiconductor device 1 according to the second embodiment, FIG. 6 is an enlarged plan view of an area C of FIG. 5, and FIG. 7 is a diagram viewed from a cross section taken along line D-D' of FIG. 5.

In the semiconductor device 1 in the present embodiment, the shape of each of a plurality of bonding pads 4' is, for example, a hexagon. As shown in FIG. 5, the height and width of each of the plurality of bonding pads 4' are identical to the height and width of a probe pad 5. The shape of the bonding pad 4' is not limited to a hexagon.

As shown in FIG. 6, a part of a first probe pad 5a is located between a second bonding pad 4b' and a second probe pad 5b, a part of the second bonding pad 4b' is located between a first bonding pad 4a' and the first probe pad 5a, and a first composite pad 7a' and a second composite pad 7b' are arranged in an interlocking manner with a space left therebetween.

As described above, according to the present embodiment, as in the first embodiment, as shown in FIG. 6, the first composite pad 7a' and the second composite pad 7b' arranged in an interlocking manner with a space left therebetween, which makes it possible to make effective use of a limited area on the semiconductor chip 3. Moreover, the height 9ah of a first bonding wire 9a above a substrate 2 is lower than the height 9bh of a second bonding wire 9b above the substrate 2 (9bh>9ah). By placing the second bonding pad 4b' in a location on the semiconductor chip 3 closer to the exterior, it is possible to shorten the length of the bonding wire 9b and make lower the height thereof above the substrate 2. This makes it possible to reduce the package thickness of the semiconductor device 1. According to the present embodiment, by adopting a hexagon as the shape of the bonding pad 4', it is possible to make lower the height 9bh of the second bonding wire 9b above the substrate 2 than that of the semiconductor device 1 according to the first embodiment.

As in the semiconductor device 1 according to the first embodiment, it is possible to achieve a high degree of integration and a small package thickness and obtain good electrical connection.

Third Embodiment

Figure 8:
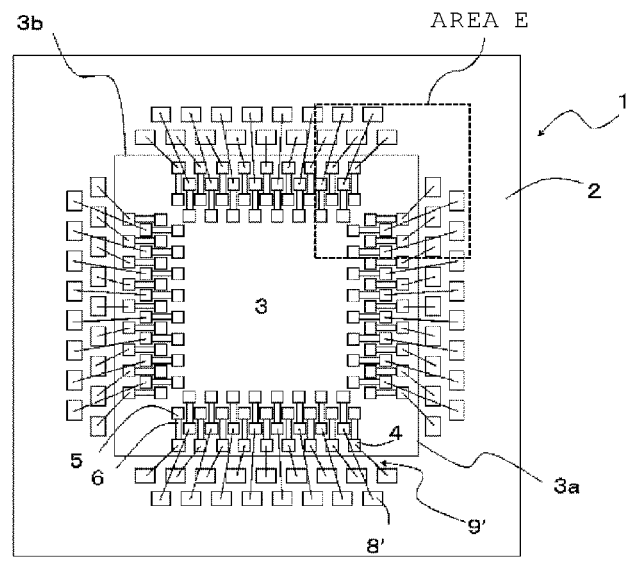
FIG. 8 is a plan view showing the internal structure of a semiconductor device according to a third embodiment.
Figure 9:
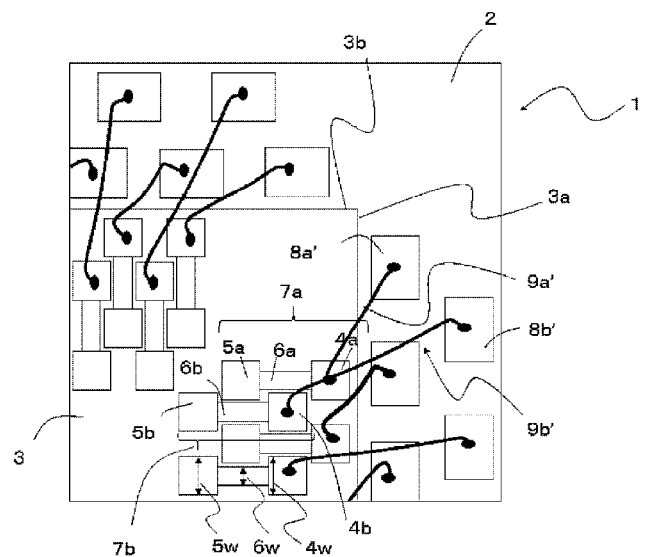
FIG. 9 is an enlarged plan view of an area E of FIG. 8.

Next, a semiconductor device 1 according to a third embodiment of the present disclosure will be described with reference to FIGS. 8 and 9. FIG. 8 is a plan view showing the internal structure of the semiconductor device 1 according to the third embodiment. FIG. 9 is an enlarged plan view of an area E of FIG. 8.

As shown in FIG. 9, in the semiconductor device 1 according to the third embodiment, first and second connection pads 8a' and 8b' are larger than first and second bonding pads 4a and 4b, and the shape of each of the first and second connection pads 8a' and 8b' is a rectangle. Moreover, first and second bonding wires 9a' and 9b' spread outward from the semiconductor chip 3.

That is, the plurality of connection pads 8 and the plurality of probe pads 5 are identical in shape (e.g., a square) and size in the semiconductor devices 1 according to the first and second embodiments; they are not identical in shape and size in the semiconductor device 1 according to the third embodiment.

As described above, according to the present embodiment, as in the first embodiment, as shown in FIG. 9, a first composite pad 7a and a second composite pad 7b arranged in an interlocking manner with a space left therebetween, which makes it possible to make effective use of a limited area on the semiconductor chip 3. Moreover, in wire bonding, the interval between the adjacent first bonding wire 9a' and second bonding wire 9b' is extended on the connection pad side. This makes it possible to prevent a short circuit which may be caused by contact between the bonding wires.

Fourth Embodiment

Figure 10:
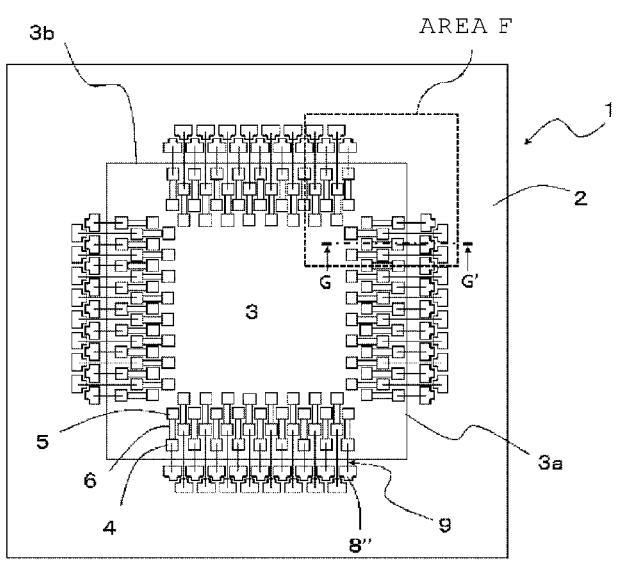
FIG. 10 is a plan view showing the internal structure of a semiconductor device according to a fourth embodiment.
Figure 11:
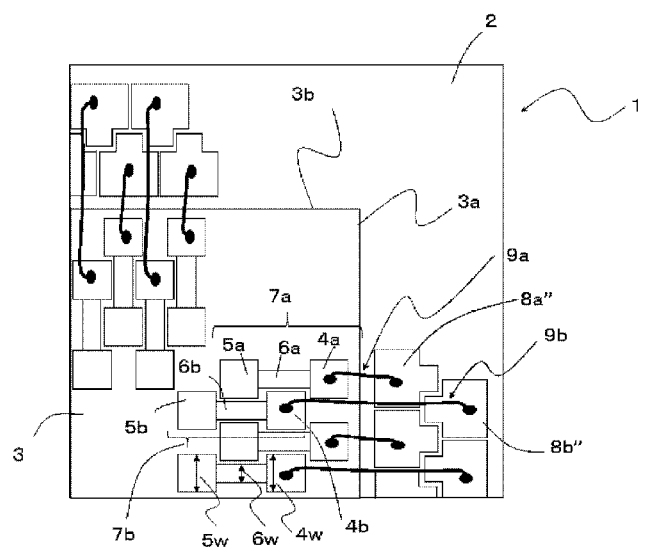
FIG. 11 is an enlarged plan view of an area F of FIG. 10.
Figure 12:
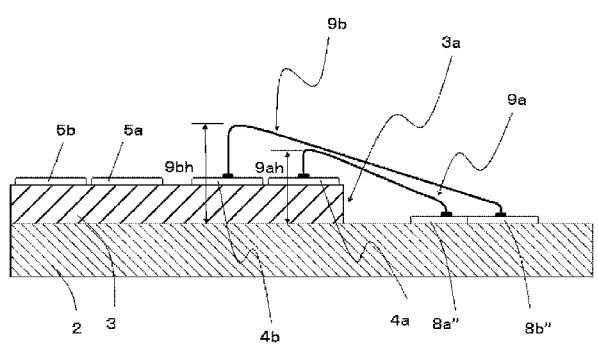
FIG. 12 is a diagram viewed from a cross section taken along line G-G' of FIG. 10.

A semiconductor device 1 according to a fourth embodiment of the present disclosure will be described with reference to FIGS. 10 to 12. FIG. 10 is a plan view showing the internal structure of the semiconductor device 1 according to the fourth embodiment. FIG. 11 is an enlarged plan view of an area F of FIG. 10. FIG. 12 is a diagram viewed from a cross section taken along line G-G' of FIG. 10.

As shown in FIG. 11, in the semiconductor device 1 according to the fourth embodiment, first and second connection pads 8a" and 8b" have shapes that allow them to be arranged in an interlocking manner with a space left therebetween, and are not squares. Moreover, the size of each of the first and second connection pads 8a" and 8b" is larger than the size of each of first and second bonding pads 4a and 4b and first and second probe pads 5a and 5b.

That is, as in the semiconductor device 1 according to the third embodiment, although a plurality of connection pads 8" and a plurality of probe pads 5 are not identical in shape and size, the first connection pad 8a" and the second connection pad 8b" are arranged in an interlocking manner with a space left therebetween.

As described above, according to the present embodiment, as in the first embodiment, as shown in FIG. 11, a first composite pad 7a and a second composite pad 7b are arranged in an interlocking manner with a space left therebetween, which makes it possible to make effective use of a limited area on a semiconductor chip 3. Moreover, the height 9ah of a first bonding wire 9a above a substrate 2 is lower than the height 9bh of a second bonding wire 9b above the substrate 2 (9bh>9ah). By placing the second connection pad 8b" in a location on the substrate 2 closer to the interior of the substrate 2, it is possible to shorten the length of the bonding wire 9b and make lower the height thereof above the substrate 2. This makes it possible to reduce the package thickness of the semiconductor device 1. According to the present embodiment, by adopting a convex shape as the shape of each of the first and second connection pads 8a" and 8b", it is possible to make lower the height 9bh of the second bonding wire 9b above the substrate 2 than those of the semiconductor devices 1 according to the first and second embodiments.

According to the semiconductor device 1 of at least one of the embodiments described above, by placing the first composite pad 7a and the second composite pad 7b or the first composite pad 7a' and the second composite pad 7b' such that they are arranged in an interlocking manner with a space left therebetween, it is possible to implement a wire bonding structure that can achieve a high degree of integration and a small package thickness and obtain good electrical connection.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a substrate;
a semiconductor chip provided above a surface of the substrate and having a first side extending in a first direction and a second side extending in a second direction crossing the first direction;
a plurality of bonding pads provided on a surface of the semiconductor chip along the first side;
a plurality of probe pads provided on the surface of the semiconductor chip and placed in locations closer to an interior of the semiconductor chip than the plurality of bonding pads with respect to the first side;
a plurality of connection pads provided on the surface of the substrate along the first side; and
a plurality of bonding wires, each electrically connecting a corresponding one of the plurality of bonding pads and a corresponding one of the plurality of connection pads, wherein
the plurality of bonding pads include a first bonding pad and a second bonding pad placed in a location closer to an interior of the semiconductor chip than the first bonding pad with respect to the first side,
the plurality of probe pads include a first probe pad electrically connected to the first bonding pad and a second probe pad electrically connected to the second bonding pad and placed in a location closer to an interior of the semiconductor chip than the first probe pad with respect to the first side, and
a part of the first probe pad is disposed between the second bonding pad and the second probe pad in the second direction.

2. The semiconductor device according to claim 1, further comprising:
a plurality of connecting portions having a width in the first direction which is smaller than a width of each of the plurality of bonding pads in the first direction and a width of each of the plurality of probe pads in the first direction, the connecting portions including a first connecting portion electrically connecting the first bonding pad and the first probe pad and a second connecting portion electrically connecting the second bonding pad and the second probe pad.

3. The semiconductor device according to claim 2, further comprising:
a first composite pad including the first bonding pad, the first probe pad, and the first connecting portion; and
a second composite pad including the second bonding pad, the second probe pad, and the second connecting portion.

4. The semiconductor device according to claim 3, wherein
the first composite pad and the second composite pad are arranged in an interlocking manner with a space left therebetween.

5. The semiconductor device according to claim 1, wherein
a distance from the second side to the second bonding pad is greater than a distance from the second side to the first bonding pad, and
a distance from the second side to the second probe pad is greater than a distance from the second side to the first probe pad.

6. The semiconductor device according to claim 1, wherein
a width of the first bonding pad in the first direction is identical to a width of the first probe pad in the first direction, and
a width of the first bonding pad in the second direction is identical to a width of the first probe pad in the second direction.

7. The semiconductor device according to claim 1, wherein
the plurality of connection pads include a first connection pad and a second connection pad,
the plurality of bonding wires include a first bonding wire electrically connecting the first bonding pad and the first connection pad, and a second bonding wire electrically connecting the second bonding pad and the second connection pad, and
a height of the first bonding wire above the substrate is lower than a height of the second bonding wire above the substrate.

8. The semiconductor device according to claim 7, wherein
a plurality of connection pads having the same configuration as the first connection pad and a plurality of bonding pads having the same configuration as the second bonding pad are alternately and repeatedly placed in the first direction, and
a plurality of bonding pads having the same configuration as the first connection pad and a plurality of bonding pads having the same configuration as the second connection pad are alternately and repeatedly placed in the first direction.

9. The semiconductor device according to claim 1, wherein
a shape of each of the plurality of probe pads is a quadrangle and a shape of each of the plurality of bonding pads is a hexagon.

10. The semiconductor device according to claim 1, wherein
the plurality of connection pads are bigger than the first bonding pad and the second bonding pad and include a first connection pad and a second connection pad,
the plurality of bonding wires include a first bonding wire electrically connecting the first bonding pad and the first connection pad, and a second bonding wire electrically connecting the second bonding pad and the second connection pad, and
a spacing between the first bonding wire and the second bonding wire in the first direction is wider at locations closer to the plurality of connection pads than farther from the plurality of connection pads.

11. The semiconductor device according to claim 1, wherein
the plurality of connection pads include a first connection pad and a second connection pad, and
a part of the first connection pad overlaps the second connection pad in the second direction.

12. The semiconductor device according to claim 11, wherein
each of the plurality of connection pads is bigger than the first bonding pad and the second bonding pad.

13. The semiconductor device according to claim 1, wherein
a probe contact mark is present on the plurality of probe pads.

14. A semiconductor device comprising:
a semiconductor chip having a first side extending in a first direction and a second side extending in a second direction crossing the first direction;
a plurality of bonding pads provided on a surface of the semiconductor chip along the first side; and
a plurality of probe pads provided on the surface of the semiconductor chip and placed in locations closer to an interior of the semiconductor chip than the plurality of bonding pads with respect to the first side, wherein
the plurality of bonding pads include a first bonding pad and a second bonding pad placed in a location closer to an interior of the semiconductor chip than the first bonding pad with respect to the first side, and the plurality of probe pads include a first probe pad electrically connected to the first bonding pad and a second probe pad electrically connected to the second bonding pad and placed in a location closer to an interior of the semiconductor chip than the first probe pad with respect to the first side, and a part of the first probe pad is disposed between the second bonding pad and the second probe pad in the second direction.

15. The semiconductor device according to claim 14, further comprising:
a plurality of connecting portions having a width in the first direction which is smaller than a width of each of the plurality of bonding pads in the first direction and a width of each of the plurality of probe pad in the first direction, the connecting portions including a first connecting portion electrically connecting the first bonding pad and the first probe pad and a second connecting portion electrically connecting the second bonding pad and the second probe pad.

16. The semiconductor device according to claim 14, wherein
a shape of each of the plurality of probe pads is a quadrangle and a shape of each of the plurality of bonding pads is a hexagon.

17. The semiconductor device according to claim 14, wherein
a probe contact mark is present on the plurality of probe pads, and no probe contact mark is present on the plurality of bonding pads.

18. A semiconductor device comprising:
a substrate;
a semiconductor chip provided above a surface of the substrate and having a first side extending in a first direction and a second side extending in a second direction crossing the first direction;
a plurality of bonding pads provided on a surface of the semiconductor chip along the first side;
a plurality of probe pads provided on the surface of the semiconductor chip along the first side in locations closer to an interior of the semiconductor chip than the plurality of bonding pads with respect to the first side;
a plurality of connecting portions, each electrically connecting a corresponding one of the plurality of bonding pads and a corresponding one of the plurality of probe pads and having a width in the first direction which is smaller than a width of each of the bonding pads in the first direction and a width of each of the probe pads in the first direction;
a plurality of connection pads provided on the surface of the substrate along the first side; and
a plurality of bonding wires, each electrically connecting a corresponding one of the plurality of bonding pads and a corresponding one of the plurality of connection pads, wherein
the plurality of bonding pads include a first bonding pad and a second bonding pad placed in a location closer to an interior of the semiconductor chip than the first bonding pad with respect to the first side, the plurality of probe pads include a first probe pad and a second probe pad placed in a location closer to an interior of the semiconductor chip than the first probe pad with respect to the first side, and the plurality of connecting portions include a first connecting portion that electrically connects the first bonding pad and the first probe pad and a second connecting portion that is placed in a location closer to an interior of the semiconductor chip than the first connecting portion with respect to the first side and electrically connects the second bonding pad and the second probe pad, and a part of the first probe pad is present between the second bonding pad and the second probe pad in the second direction, and a part of the second bonding pad is present between the first bonding pad and the first probe pad in the second direction.

19. The semiconductor device according to claim 18, wherein
the plurality of connection pads include a first connection pad and a second connection pad, and
a part of the first connection pad overlaps the second connection pad in the second direction.

20. The semiconductor device according to claim 19, wherein
each of the plurality of connection pads is bigger than the first bonding pad and the second bonding pad.

* * * * *